(12) United States Patent
Wu et al.

(10) Patent No.: US 9,847,302 B2
(45) Date of Patent: Dec. 19, 2017

(54) WAFER SURFACE CONDITIONING FOR STABILITY IN FAB ENVIRONMENT

(71) Applicant: Taiwan Semiconductor Manufacturing Co., Ltd., Hsin-Chu (TW)

(72) Inventors: Tsiao-Chen Wu, Jhudong Township (TW); Fang Lin, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 6 days.

(21) Appl. No.: 13/974,246

(22) Filed: Aug. 23, 2013

(65) Prior Publication Data

US 2015/0054142 A1 Feb. 26, 2015

(51) Int. Cl.
| | |
|---|---|
| H01L 23/58 | (2006.01) |
| H01L 23/00 | (2006.01) |
| H01L 23/31 | (2006.01) |
| H01L 21/027 | (2006.01) |
| H01L 21/306 | (2006.01) |
| H01L 21/308 | (2006.01) |

(52) U.S. Cl.
CPC .......... *H01L 23/564* (2013.01); *H01L 21/027* (2013.01); *H01L 21/306* (2013.01); *H01L 21/3081* (2013.01); *H01L 23/3171* (2013.01); *H01L 2924/0002* (2013.01)

(58) Field of Classification Search
CPC ......... H01L 21/02104; H01L 21/02106; H01L 21/02214; H01L 21/02216; H01L 29/7869
USPC ...................................................... 438/780
See application file for complete search history.

(56) References Cited

U.S. PATENT DOCUMENTS

| | | | | |
|---|---|---|---|---|
| 5,830,619 | A * | 11/1998 | Chin ..................... | G03F 7/0045 430/270.1 |
| 6,599,437 | B2 * | 7/2003 | Yauw .................. | H01L 21/0276 216/47 |
| 6,602,794 | B1 * | 8/2003 | Kye ......................... | G03F 7/40 257/E21.026 |
| 7,064,075 | B2 * | 6/2006 | Di Dio .................... | G03F 7/091 257/E21.027 |
| 7,678,712 | B2 | 3/2010 | Bhanap et al. | |
| 8,435,903 | B2 * | 5/2013 | Ogawa ................ | H01L 21/0206 438/745 |

(Continued)

OTHER PUBLICATIONS

Yogesh Mhaisagar, Bhavana Joshi, and A. Mahajan, "Surface texture modification of spin-coated SiO2 xerogel thin films by TMCS silylation" published in Apr. 2012 in Bulletin of Materials Science vol. 35, pp. 151-155.*

(Continued)

*Primary Examiner* — Jesse Y Miyoshi
*Assistant Examiner* — Tuan A Hoang
(74) *Attorney, Agent, or Firm* — Eschweiler & Potashnik, LLC

(57) ABSTRACT

Hydroxyl moieties are formed on a surface over a semiconductor substrate. The surfaces are silylized to replace the hydroxyl groups with silyl ether groups, the silyl ether groups being of the form: —$OSiR_1R_2R_3$, where $R_1$, $R_2$, and $R_3$ are each hydrocarbyl groups comprising at least one carbon atom. Silylation protects the wafers from forming defects through hydrolysis while the wafers are being transported or stored under ambient conditions.

18 Claims, 4 Drawing Sheets

(56) References Cited

U.S. PATENT DOCUMENTS

| | | | | |
|---|---|---|---|---|
| 2002/0072225 | A1* | 6/2002 | Laaksonen | H01L 21/31116 438/636 |
| 2007/0155179 | A1* | 7/2007 | Ho | H01L 21/3086 438/700 |
| 2008/0206690 | A1* | 8/2008 | Kennedy | C08G 77/20 430/496 |
| 2010/0092895 | A1* | 4/2010 | Zhang | C08G 77/045 430/325 |
| 2010/0210744 | A1* | 8/2010 | Zhang | B01J 20/265 521/50 |
| 2011/0027957 | A1* | 2/2011 | Berry | H01L 21/223 438/301 |
| 2011/0195190 | A1* | 8/2011 | Koshiyama | C09K 3/18 427/284 |
| 2011/0315618 | A1* | 12/2011 | Hiroe | B01J 20/286 210/198.2 |
| 2012/0040112 | A1* | 2/2012 | Meldel et al. | 428/34.1 |
| 2012/0251721 | A1* | 10/2012 | Matsumoto | C23C 16/40 427/248.1 |
| 2013/0017328 | A1* | 1/2013 | Miyoshi et al. | 427/255.37 |
| 2013/0052774 | A1* | 2/2013 | Kurobe | 438/98 |

OTHER PUBLICATIONS

Richard C. Jaeger, "Introduction to Microelectronic Fabrication" published by Addison-Wesley Publishing Company in 1988. pp. 14 and 16.*

Corey et al. "Studies with trialkylsilyl/triflates: new syntheses and applicaitons" Tetrahedron Letters, vol. 22, pp. 3455-3458. Published by Pergamon Press Ltd in 1981.* van Look et al. "Silylating Agents: Derivatization reagents protecting-group reagents organosilicon compounds analytical applications synthetic applications" in Fluka Chemika. pp. 54-100. Published by Fluka Chemie AG in 1995.* van Look et al. "Silylating Agents", published by Fluka Chemie AG in 1995.* van Look et al. "Silylating agents", published by Fluka Chemika AG in 1995.*

Jaeger "Introduction to Microelectronic Fabrication" pp. 14-16. Published by Addison-Wesley Publishing company in 1988.*

Quirk & Serda "Semiconductor Manufacturing Technology" p. 123. Published by Prentice Hall, Inc. in 2001.*

Van Look et al. Fluka Chemika "Silylating Agents", published by Fluka Chemie AG in 1995.*

Jaeger, "Introduction to Microelectronic Fabrication", pp. 14 and 16, published by Addison-Wesley Publishing Company in 1988.*

"Silylating and Silanes in Organic Synthesis"; Alfa Aesar: A Johnson Matthey Company; www.alfa.com; publication date prior to Aug. 23, 2013; p. 1-12.

Baltzinger, et al. "Contamination Monitoring and Analysis in Semiconductor Manufacturing." Semiconductor Technologies. ISBN 978-953-307-080-3, pp. 57-78. Published Apr. 1, 2010.

* cited by examiner

WAFER SURFACE CONDITIONING FOR STABILITY IN FAB ENVIRONMENT

FIELD

The present disclosure relates to systems and methods for integrated circuit device manufacturing.

BACKGROUND

With hundreds of process steps and expensive equipment, queue time control is critical to the economic viability of an integrated circuit device manufacturing facility. As wafers are processed through the facility, they must often be protected from the ambient environment. If, following completion of processing in one tool, the next tool is not immediately available, wafers must often be stored in a protected environment. The wafers can be stored within the tool in which they have completed processing, but this forces the tool to become idle. Alternatively, the wafers can be stored in an environmentally controlled storage rack. Such storage racks are additional structures that take up valuable plant floor space and require additional capital investment.

DETAILED DESCRIPTION

Figure 1:
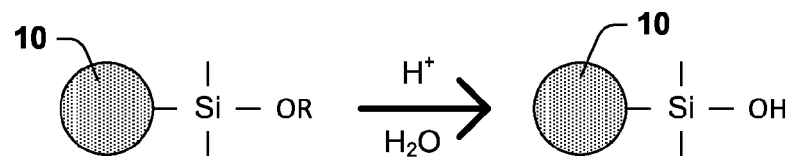
FIG. 1 illustrates a hydrolysis reaction.
Figure 2:
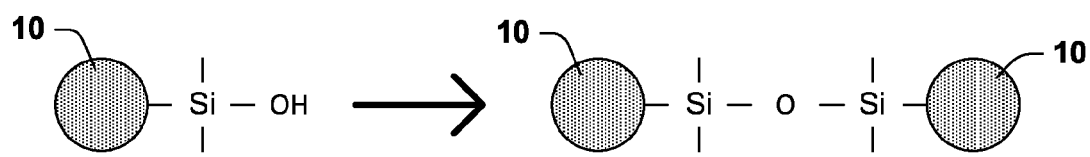
FIG. 2 illustrates cross-linking of hydroxyl moieties on a wafer surface.

The inventors have determined that wafers exposed to ambient conditions within an integrated circuit manufacturing facility can develop defects through moisture-induced hydrolysis and subsequent cross-linking. FIG. 1 illustrates moisture-induced hydrolysis of an ether group attached to a Si atom on a surface 10 of a wafer. The hydroxyl moieties are reactive and can cross-link as illustrated by FIG. 2. Cross-linking can occur over extended areas, changing the surface topography and producing defects. The inventors have further determined that silylation can protect the wafers sufficiently to allow them to be exposed to these ambient conditions.

The term "silylation" as used herein is the substitution of a hydrogen atom bound to a an oxygen atom (—OH) by a silyl group to form a silyl ether. A silyl ether has the form: —OSiR$^1$R$^2$R$^3$, where R$^1$, R$^2$, and R$^3$ can be any suitable ligands. In some embodiment, R$^1$, R$^2$, and R$^3$ are all the same and the silyl ether is of the form: —OSiR$^1{}_3$. In some embodiments, R$^1$, R$^2$, and R$^3$ are hydrocarbyl groups, which are generally effective for protecting wafer surfaces. Examples of hydrocarbyl groups include alkyl, vinyl, aryl, allyl, and alkynyl groups.

Silyl ethers are resistant to both basic and acid hydrolysis. This can be due in part to the hydrophobicity of the silyl group and in part to steric hindrance. Steric hinderance can be enhanced by providing bulkier R$^1$, R$^2$, and R$^3$, e.g., trialkylsilyl. Accordingly, in some embodiments, R$^1$, R$^2$, and R$^3$ are hydrocarbyl groups each having two or more carbon atoms. Electron-withdrawing R$^1$, R$^2$, and R$^3$ groups, e.g., phenyl groups, can be selected to increase stability to acidic hydrolysis while decreasing stability to basic hydrolysis and vice versa. Depending on anticipated conditions, in some embodiments R$^1$, R$^2$, and R$^3$ are substantially more electron withdrawing than —CH$_3$ and in some other embodiments R$^1$, R$^2$, and R$^3$ are substantially less electron withdrawing than —CH$_3$.

Figure 3:
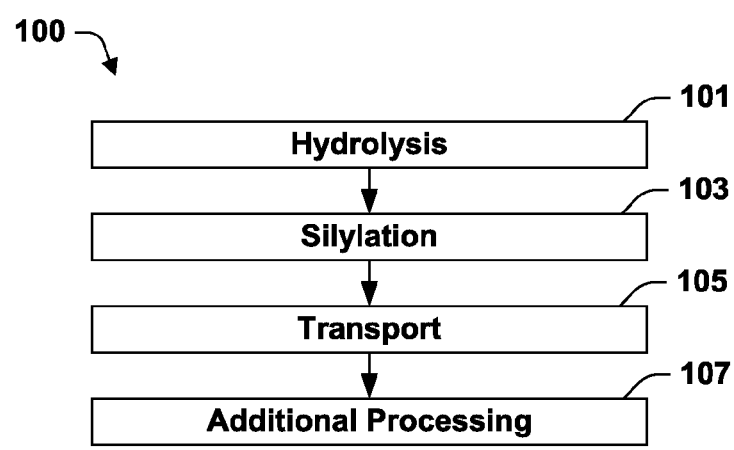
FIG. 3 provides a flow chart of a process according to one embodiment of the present disclosure.

FIG. 3 illustrates an example process 100 according to an embodiment provided by the present disclosure. The process 100 begins with hydrolysis 101 of an exposed surface 10 as illustrated in FIG. 1. A surface may be all or partially hydrolyzed incidentally to its formation or as a consequence of processing for another purpose. Hydrolysis can be accomplished in any suitable manner. Hydrolysis can include the application of purified water such as deionized or distilled water. Hydrolysis can be facilitated by an acid or a base. In some embodiments, hydrolysis comprises treating the exposed surface 10 with an acidic solution. Dilute hydrofluoric acid (DHA) and Buffer Oxide Etch (BOE) can be particularly effective. Accordingly, in some embodiments hydrolysis comprises treating the exposed surface 10 with a solution comprising hydrofluoric acid.

Figure 4:
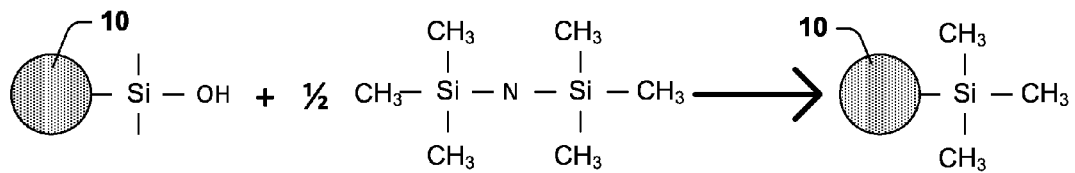
FIG. 4 illustrates a silylation reaction according to an embodiment of the present disclosure.

Process 100 of FIG. 3 continues with silylation 103. Silylation involves treating the surface 10 with a silyliating agent. A silyliating agent is generally of the form: Y—(OSiR$^1$R$^2$R$^3$)$_N$, where N is an integer between 1 and the valence of Y. Y can be any suitable species. Examples of species that can be suitable for Y include F, Cl, Br, I, amines, and amides. Where R$^1$, R$^2$, and R$^3$ are all methyl groups, the silyliating agent can be any of allyltrimethylsilane, N,O-Bis(trimethylsilyl)acetamide (BSA), N,O-Bis(trimethylsilyl) carbamate (BSC), N,N-Bis(trimethylsilyl)formamide (BSF), N,N-Bis(trimethylsilyl)methylamine, Bis(trimethylsilyl) sulfate (BSS), N,O-Bis(trimethylsilyl)trifluoroacetamide (BSTFA), N,N'-Bis(trimethylsilyl)urea (BSU), (Ethylthio)trimethylsilane, Ethyl trimethylsilylacetate (ETSA), Hexamethyldisilane, Hexamethyldisilazane, Hexamethyldisiloxane (HMDSO), Hexamethyldisilthiane, (Isopropenyloxy)trimethylsilane (IPOTMS), 1-Methoxy-2-methyl-1-trimethylsiloxypropene, (Methylthio)trimethylsilane, Methyl 3-trimethylsiloxy-2-butenoate, N-Methyl-N-trimethylsilylacetamide (MSA), Methyl trimethylsilylacetate, N-Methyl-N-trimethylsilylheptafluorobutyramide (MSHFBA), N-Methyl-N-trimethylsilyltrifluoroacetamide (MSTFA), (Phenylthio)trimethylsilane, Trimethylbromosilane (TMBS), Trimethylchlorosilane (TMCS), Trimethyliodosilane, (TMIS), 4-Trimethylsiloxy-3-penten-2-one (TM-Sacac), N-(Trimethylsilyl)acetamide, (TMS-acetamide), Trimethylsilyl acetate, Trimethylsilyl azide, Trimethylsilyl benzenesulfonate, Trimethylsilyl cyanide (TMSCN), N-(Trimethylsilyl)diethylamine (TMSDEA), N-(Trimethylsilyl)dimethylamine (TMSDMA), Trimethylsilyl N,N-dimethylcarbamate (DMCTMS), 1-(Trimethylsilyl)imidazole (TMSIM), Trimethylsilyl methanesulfonate, 4-(Trimethylsilyl)morpholine, 3-Trimethylsilyl-2-oxazolidinone (TMSO), Trimethylsilyl perfluoro-1-butanesulfonate (TMS nonaflate), Trimethylsilyl trichloroacetate, Trimethylsilyl trifluoroacetate, and Trimethylsilyl trifluoromethanesulfonate (TMS triflate). Chemically analogous silyliating agents can be identified by substituting one or more of the methyl groups with other desired R$^1$, R$^2$, and R$^3$ in the foregoing examples. FIG. 4 illustrates the reaction where the silyliating agent is HMDS. A mixture silyliating agents can also be used.

The process 100 continues with an optional action of transporting 105, which is transporting the silylized wafer through the ambient environment of a manufacturing facility. Processing of wafers typically takes place in a series of modules, tools, or tracks each having a controlled environment. For example, separate modules may be provided for CVD coating, cleaning, lithographic patterning, and etching. Between modules, tools, or tracks, it may be convenient to move wafers through or store wafers in the ambient environment. The process 100 illustrates this with an optional action of transporting 105 and the subsequent action 107, which is further processing in a separate module, tool, or track from the one in which silylation takes place.

While silylation according to the present disclosure can be used to protect a wafer from exposure to the ambient environment, the silylation can also be used for other purposes. In some embodiments, silylation is used to protect a wafer from polar contaminants, which protection may be desired within the same process unit (module, tool, or track) within which silylation takes place. In some other embodiments, silylation renders the surface hydrophobic, which facilitate uniform wetting by non-polar liquids and uniform coating using a liquid precursor carried in a non-polar solution.

Figures 5, 6:
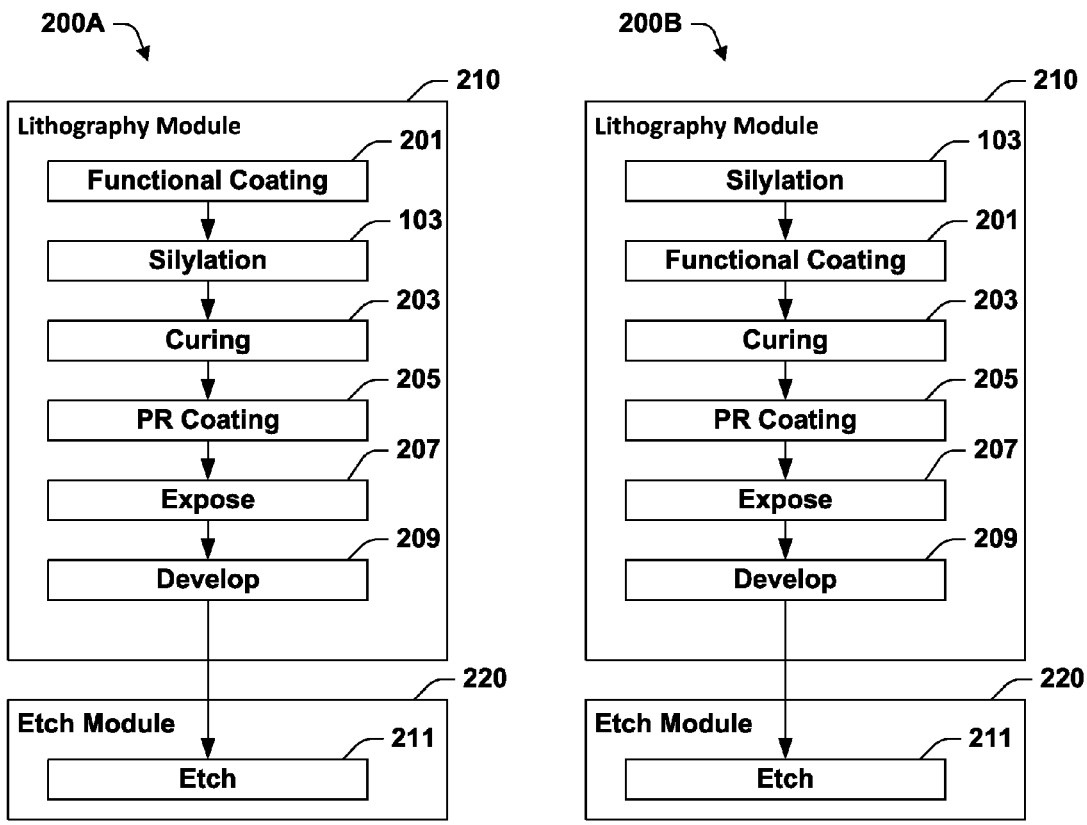
FIGS. 5-8 provide flow charts of processes according to an additional embodiment of the present disclosure.

FIG. 5 provide a flow chart for a process 200A, which is an example of embodiments in which silylation is useful within the same process unit in which silylation takes place. In process 200A, silylation takes place and is functional within a lithography module 210. FIGS. 9-13 illustrate a wafer 400 being processed through the module 210. Action 201 forms a functional coating 401 over a surface 402 of the wafer 400. A functional coating can be any coating that is patterned and subsequently becomes part of an integrated circuit device. A functional coating can be a dielectric coating, a polysilicon coating, or another type of conductive coating. A functional coating can include multiple layers having various compositions.

In process 200A of FIG. 5, silylation 103 follows action 201, forming functional coating 401. Hydrolysis 101 can be applied after forming the functional coating 401 and before silylation if necessary. In process 200A, silylation 103 modifies a surface 404 of the functional coating 401. Silylation 103 protects the surface 404 during subsequent processing, such as curing 203. Curing 203 can include heating then cooling the wafer 400. Silylation protects the wafer surface 404 formed by the functional coating 401 against hydrolysis and from contamination by polar contaminants during curing 203.

Figure 11:
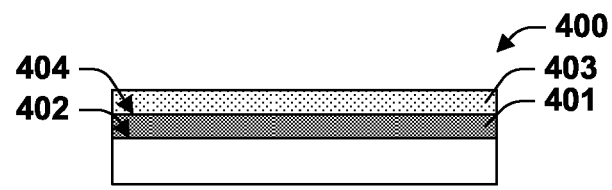
Figure 12:
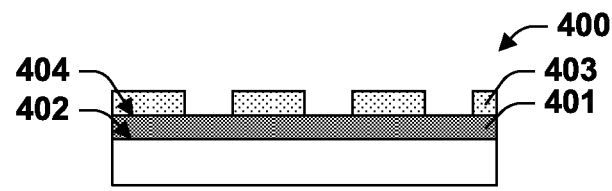
Figure 13:
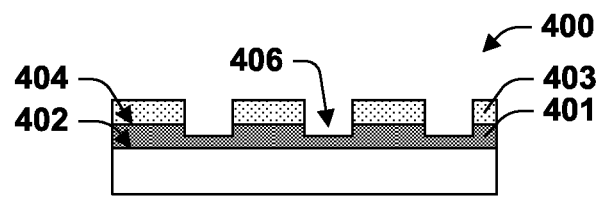

Processing within the lithography module 210 can further include action 205, which forms a photoresist coating 403 as shown in FIG. 11, action 207, which is selectively exposing the photoresist 207 according to a pattern defined by a photolithography mask, and action 209, which is developing the photoresist 403 to pattern it as shown in FIG. 12. In some embodiments a precursor for the photoresist 403 is applied with a non-polar solvent and silylation 103 facilitate coating surface 404 with photoresist 403. In some embodiments, silylation 103 protects the surface 404 from hydrolysis and or contamination by polar contaminants during developing 209. The process 200A proceeds with etching 211, which takes place in the etch module 220. Etching 211 is an etch of the functional coating 401 in the pattern of the mask 403 as shown in FIG. 13.

FIG. 6 provide a flow chart for a process 200B, which is another example of embodiments in which silylation 103 is useful within the same process unit in which silylation 103 takes place. Process 200B is similar to process 200A except that silylation 103 takes place prior to forming the functional coating 401 and protects the wafer surface 402. In this example, silylation 103 primes the surface 402 to receive a precursor for the functional coating 401.

In some embodiments, hydrolysis and silylation take place immediately after formation of the surface protected by silylation. In these embodiment, silylation generally takes place within the same process unit as the one in which the protected surface is formed. In some other embodiments, silylation takes place in a separate module following a cleaning of the protected surface.

Figure 7:
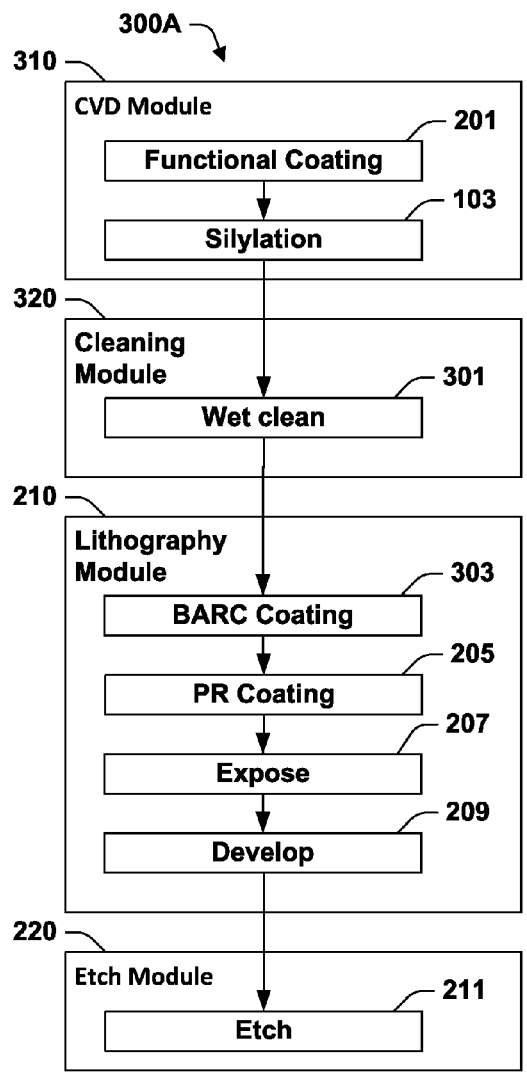

FIG. 7 provides a flow chart for a process 300A, which is an example of a process in which silylation 103 takes place in the same unit that a functional coating 401 is formed and protects a surface 404 of the functional coating 401 as the wafer 400 is transported or stored between processing units. Process 300A begins with actions taking place in a CVD module 310. Within the CVD module 310, a functional coating 401 is formed over the wafer surface 402. Hydrolysis 101 then takes place, if necessary, after which the surface 404 of the functional coating 401 is modified by silylation 103, which is also carried out in the CVD module 310. The wafer 400 is then transported to a cleaning module 320 where wet clean 301 takes place. In process 300A, silylation 103 can protect the surface 404 from hydrolysis during wet cleaning 301.

Process 300A continues with processing in a lithography module 210 and an etch module 220. Processing in these modules can be the same as described in relation to the process 200A. In this example, an additional action of forming an antireflective coating (not illustrated in the Figures) takes place prior to forming the photoresist 403. Silylation 103 can facilitate wetting of the surface 404 by a non-polar liquid and thereby forming a uniform antireflective coating over the surface 404.

Figure 8:
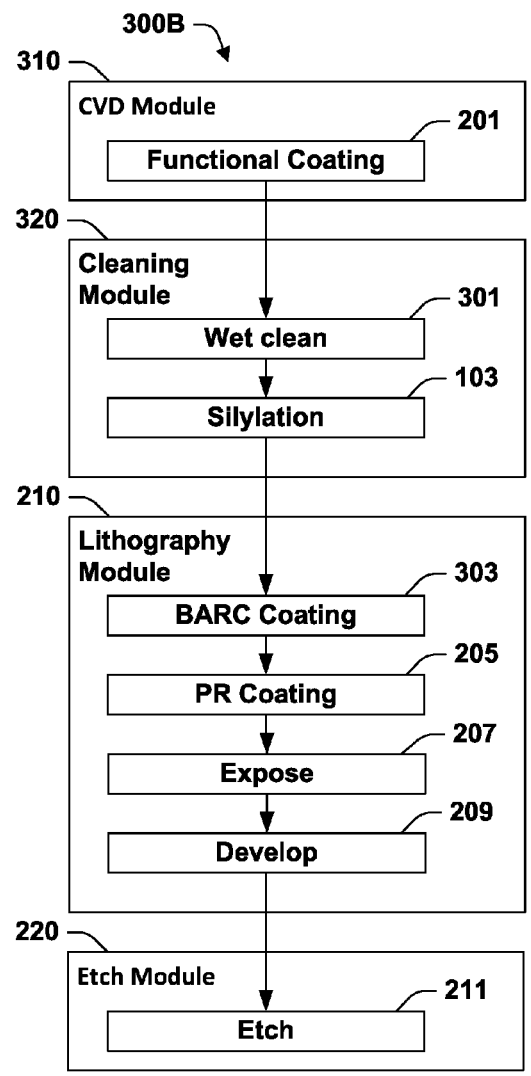
Figure 9:
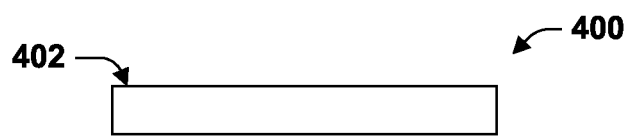
FIGS. 9-13 illustrate a wafer undergoing a lithography process.
Figure 10:
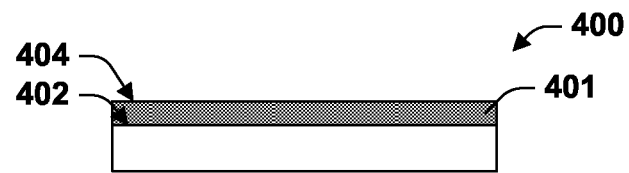

FIG. 8 provides a flow chart for a process 300B, which is an example of a process in which silylation 103 takes place in a separate unit from the one in which functional coating 401 is formed. Process 300B is similar to process 300A except that silylation 103 takes place in cleaning module 320 following wet clean 301. If wet clean 301 leaves the surface 404 hydrolyzed, than an additional process of hydrolysis 101 is unnecessary. In process 300B, silylation 103 can protect the surface 204 from hydrolysis and defect formation during transport and storage in the ambient plant environment between cleaning module 320 and lithography module 210.

Within the ambient environment of a integrated circuit device manufacturing facility, environmental parameters such as humidity are uncontrolled or are controlled to only a limited extent. As a result, relatively high humidity, such a humidity in excess of 50% saturation, will routinely occur.

A wafer as the term is used herein is a semiconductor substrate and the various coatings and structures that are formed over that substrate. A semiconductor substrate can be, for example, silicon, silicon on insulator (SOI), Ge, SiC, GaAs, GaAlAs, InP, GaN SiGe. The surface of a wafer can be a surface of a coating on the substrate. The surface affected by silylation is generally an outer surface.

The present disclosure provides an integrated circuit device fabrication plant in which there are wafers having silyl ether groups are attached to their surfaces. The silyl ether groups are of the form: —$OSiR_1R_2R_3$, where $R_1$, $R_2$, and $R_3$ are each hydrocarbyl groups comprising at least one carbon atom.

The present disclosure provides a method of manufacturing integrated circuits in which hydroxyl moieties are formed on a surface over a semiconductor substrate. The surfaces are silylized to replace the hydroxyl groups with silyl ether groups, the silyl ether groups being of the form: —OSiR$_1$R$_2$R$_3$, where R$_1$, R$_2$, and R$_3$ are each hydrocarbyl groups comprising at least one carbon atom.

The present disclosure provides a method of manufacturing an integrated circuit device that includes processing a wafer in an integrated circuit device manufacturing facility and silylizing a surface of the wafer so that hydroxyl groups attached to the surface are replaced by silyl ether groups, the silyl ether groups being of the form: —OSiR$_1$R$_2$R$_3$, where R$_1$, R$_2$, and R$_3$ are each hydrocarbyl groups comprising at least one carbon atom. The wafer is then further processed within the integrated circuit manufacturing facility.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. A method of manufacturing integrated circuits, comprising:
   forming a non-polysilicon, conductive layer on a semiconductor wafer within a chemical vapor deposition (CVD) module having a controlled atmosphere;
   forming hydroxyl moieties or groups on a surface of the non-polysilicon, conductive layer within the CVD module;
   silylizing the surface of the non-polysilicon, conductive layer to replace the hydroxyl moieties or groups with silyl ether groups within the CVD module, the silyl ether groups being of the form: —OSiR$_1$R$_2$R$_3$, wherein R$_1$, R$_2$, and R$_3$ are each hydrocarbyl and electron-withdrawing groups comprising at least one carbon atom, wherein the surface of the non-polysilicon, conductive layer is silylized, and wherein the semiconductor wafer remains in situ within the CVD module from a time of forming the non-polysilicon, conductive layer on the semiconductor wafer through the silylizing; and
   concurrently removing the silylized surface of the non-polysilicon, conductive layer and semiconductor wafer from the CVD module.

2. The method of claim 1, wherein R$_1$, R$_2$, and R$_3$ are each selected from the group consisting of alkynyl groups.

3. The method of claim 1, wherein silylizing the surface of the non-polysilicon, conductive layer comprises treating the surface with a silylating agent of the form YSiR$_1$R$_2$R$_3$, wherein Y is selected from the group consisting of halogen-containing compounds, amines, and amides.

4. The method of claim 1, wherein R$_1$, R$_2$, and R$_3$ each have an electron withdrawing characteristic that is different from an electron withdrawing characteristic of a methyl group, and wherein R$_1$ is different from at least one of R$_2$ and R$_3$.

5. The method according to claim 1, further comprising:
   transporting the semiconductor wafer from the CVD module to a lithography module, wherein the silylized surface is exposed to an environment of an integrated circuit device manufacturing facility during transport and the silylized surface protects the semiconductor wafer against hydrolysis and contamination by polar contaminants in the environment.

6. The method according to claim 5, wherein the environment of the integrated circuit device manufacturing facility has humidity in excess of 50% saturation during transport from the CVD module to the lithography module.

7. The method according to claim 5, further comprising:
   forming a bottom anti-reflective coating (BARC) over the silylized surface within the lithography module; and
   after silylizing the surface of the non-polysilicon, conductive layer and before forming and patterning the BARC, wet cleaning the silylized surface of the coating within a cleaning module that is different than the CVD module.

8. The method according to claim 7, further comprising:
   performing an etch into the silylized surface with the BARC in place, wherein the etch is performed within an etch module that is different than the CVD, cleaning, and lithography modules.

9. The method according to claim 8, further comprising:
   forming a photoresist layer over the BARC, wherein the semiconductor wafer remains in the lithography module from a time the BARC is formed until after the photoresist layer is formed and patterned.

10. The method according to claim 9, wherein the non-polysilicon, conductive layer is formed and silylized within the controlled atmosphere of the CVD module, wherein the wet cleaning is performed within a controlled atmosphere of the cleaning module, wherein the BARC and the photoresist layer are formed within a controlled atmosphere of the lithography module, wherein the etch is performed in a controlled atmosphere of the etch module, and wherein the controlled atmospheres respectively of the CVD module, the cleaning module, the lithography module, and the etch module are different.

11. The method of claim 1, further comprising:
    forming a uniform-thickness bottom antireflective coating (BARC) layer in direct contact with the silylized surface of the non-polysilicon, conductive layer.

12. The method of claim 11, further comprising:
    patterning the BARC layer and carrying out an etch with the BARC layer in place outside of the CVD module, wherein the etch removes portions of the silylized surface of the non-polysilicon, conductive layer based on the patterned BARC layer.

13. A method for manufacturing an integrated circuit, comprising:
    forming a non-polysilicon, conductive layer on a semiconductor wafer within a chemical vapor deposition (CVD) module;
    treating a surface of the non-polysilicon, conductive layer with a silylating agent within the CVD module, wherein the silylating agent is of the form YSiR$_1$R$_2$R$_3$ to replace hydroxyl moieties or groups with silyl ether groups, wherein the silyl ether groups are of the form: —OSiR$_1$R$_2$R$_3$, wherein Y is selected from the group consisting of halogens, halogen-containing compounds, amines, and amides, wherein R$_1$, R$_2$, and R$_3$ are each alkynyl groups comprising at least two carbon atoms, wherein the semiconductor wafer remains in situ within the CVD module from a first time of forming the non-polysilicon, conductive layer on the semiconductor wafer through a second time in which the surface of the non-polysilicon, conductive layer is treater with the silylizing agent;
    after treating the surface with the silylating agent, concurrently removing the non-polysilicon, conductive layer and the wafer from the CVD module and transporting the semiconductor wafer to a wet cleaning module, while during transport the silylated surface is exposed to an environment of an integrated circuit device manufacturing facility external to the CVD module;

performing a wet cleaning process on the silylated surface within the wet cleaning module;

after the wet cleaning process, transporting the semiconductor wafer to a lithography module and re-exposing the silylated surface to the environment of the integrated circuit device manufacturing facility, wherein the silylized surface protects against hydrolysis and contamination by polar contaminants in the environment;

forming a bottom anti-reflective coating (BARC) in direct contact with the silylized surface within the lithography module; and forming and patterning a photoresist layer over the BARC within the lithography module.

14. The method according to claim 13, wherein ambient environments respectively of the CVD, cleaning, and lithography modules have humidities in excess of 50% saturation.

15. The method according to claim 13, further comprising:

after a lithography process, exposing the semiconductor wafer and the silyl ether groups to an ambient environment of the lithography module, while transporting the semiconductor wafer to an etching module; and performing an etching process on the coating and the BARC with the photoresist layer in place, wherein the etching process is performed within the etching module.

16. A method of manufacturing integrated circuits, comprising:

forming a silicon-containing layer on a semiconductor wafer within a chemical vapor deposition (CVD) module having a controlled atmosphere;

forming hydroxyl moieties or groups on a surface of the silicon-containing layer within the CVD module;

silylizing the surface of the silicon-containing layer to replace the hydroxyl moieties or groups with silyl ether groups within the CVD module, the silyl ether groups being of the form: —$OSiR_1R_2R_3$, wherein $R_1$, $R_2$, and $R_3$ are each hydrocarbyl and electron-withdrawing groups comprising at least one carbon atom, wherein the surface of the silicon-containing layer is silylized, and wherein the semiconductor wafer remains in situ within the CVD module from a time of forming the silicon-containing layer on the semiconductor wafer through the silylizing; and concurrently removing the silylized surface of the silicon-containing layer and semiconductor wafer from the CVD module.

17. The method of claim 16, wherein $R_1$, $R_2$, and $R_3$ are each selected from a group consisting of alkynyl groups.

18. The method of claim 16, wherein silylizing the surface of the silicon-containing layer comprises treating the surface with a silylating agent of the form $YSiR_1R_2R_3$, wherein Y is selected from the group consisting of halogen-containing compounds, amines, and amides.

* * * * *